US010390438B2

(12) United States Patent
 Zhang

(10) Patent No.: US 10,390,438 B2
(45) Date of Patent: Aug. 20, 2019

(54) INTEGRATED CIRCUIT PACKAGE SUBSTRATE

(71) Applicant: Intel Corporation, Santa Clara, CA (US)

(72) Inventor: Qinglei Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 15/821,532

(22) Filed: Nov. 22, 2017

(65) Prior Publication Data
 US 2018/0098436 A1   Apr. 5, 2018

Related U.S. Application Data

(62) Division of application No. 13/870,644, filed on Apr. 25, 2013, now Pat. No. 9,832,883.

(51) Int. Cl.
 *H05K 3/24*   (2006.01)
 *H05K 3/28*   (2006.01)
 (Continued)

(52) U.S. Cl.
 CPC ......... *H05K 3/244* (2013.01); *H01L 21/4857* (2013.01); *H01L 23/13* (2013.01);
 (Continued)

(58) Field of Classification Search
 CPC ...... H05K 3/244; H05K 3/282; H05K 3/3436; H05K 2201/0376; H05K 2201/10378; H05K 2201/10734; H05K 2203/025; H05K 2203/1476; H05K 2203/1572; H01L 21/4857; H01L 23/13; H01L 24/13;
 (Continued)

(56) References Cited

U.S. PATENT DOCUMENTS 7,730,613 B2   6/2010   Vasoya
2003/0044588 A1   3/2003   Komoto et al.
 (Continued)

OTHER PUBLICATIONS

Non-Final Office Action dated Feb. 5, 2015 for U.S. Appl. No. 13/870,644, 13 pages.
 (Continued)

*Primary Examiner* — Peter Dungba Vo
*Assistant Examiner* — Azm A Parvez
(74) *Attorney, Agent, or Firm* — Schwabe, Williamson & Wyatt, P.C.

(57) ABSTRACT

Embodiments of the present disclosure are directed towards techniques and configurations for dual surface finish package substrate assemblies. In one embodiment a method includes depositing a first surface finish on one or more electrical routing features located on a first side of a package substrate and on one or more lands located on a second side of the package substrate, the second side being opposite the first side of the substrate. The method may further include removing the first surface finish on the first side of the package substrate; and depositing a second surface finish on the one or more electrical routing features of the first side. The depositing of the second surface finish may be accomplished by one of a Direct Immersion Gold (DIG) process or an Organic Solderability Preservative (OSP) process. Other embodiments may be described and/or claimed.

10 Claims, 6 Drawing Sheets

(51) Int. Cl.
*H01L 23/13* (2006.01)
*H01L 21/48* (2006.01)
*H05K 3/34* (2006.01)
*H01L 23/00* (2006.01)

(52) U.S. Cl.
CPC .............. *H05K 3/282* (2013.01); *H01L 24/13* (2013.01); *H01L 24/16* (2013.01); *H01L 24/81* (2013.01); *H01L 2224/131* (2013.01); *H01L 2224/16227* (2013.01); *H01L 2224/81191* (2013.01); *H01L 2224/81444* (2013.01); *H01L 2224/81801* (2013.01); *H01L 2924/12042* (2013.01); *H05K 3/3436* (2013.01); *H05K 2201/0376* (2013.01); *H05K 2201/10378* (2013.01); *H05K 2201/10734* (2013.01); *H05K 2203/025* (2013.01); *H05K 2203/1476* (2013.01); *H05K 2203/1572* (2013.01)

(58) Field of Classification Search
CPC ... H01L 24/16; H01L 24/81; H01L 2224/131; H01L 2224/16227; H01L 2224/81191; H01L 2224/81444; H01L 2224/81801; Y10T 29/49155; Y10T 29/49124; Y10T 29/49117; Y10T 29/49002
USPC ................................. 29/846, 829, 825, 592.1
See application file for complete search history.

(56) References Cited

U.S. PATENT DOCUMENTS

| | | |
|---|---|---|
| 2009/0283898 A1 | 11/2009 | Janzen et al. |
| 2011/0108999 A1 | 5/2011 | Nalla et al. |
| 2011/0147933 A1 | 6/2011 | Wu et al. |
| 2011/0228464 A1 | 9/2011 | Guzek et al. |
| 2012/0161330 A1* | 6/2012 | Hlad .................. H01L 24/16 257/774 |
| 2014/0159850 A1 | 6/2014 | Roy et al. |
| 2014/0231127 A1* | 8/2014 | Manero .................. H05K 3/243 174/266 |

OTHER PUBLICATIONS

Final Office Action dated Jun. 4, 2015 for U.S. Appl. No. 13/870,644, 10 pages.
Non-Final Office Action dated Feb. 22, 2016 for U.S. Appl. No. 13/870,644, 10 pages.
Final Office Action dated Jul. 14, 2016 for U.S. Appl. No. 13/870,644, 9 pages.
Non-Final Office Action dated Apr. 17, 2017 for U.S. Appl. No. 131870,644, 10 pages.
Notice of Allowance dated Aug. 7, 2017 for U.S. Appl. No. 13/870,644, 8 pages.

* cited by examiner

INTEGRATED CIRCUIT PACKAGE SUBSTRATE

CROSS REFERENCE TO RELATED APPLICATION

This application is a divisional application of U.S. patent application Ser. No. 13/870,644, entitled "INTEGRATED CIRCUIT PACKAGE SUBSTRATE", filed Apr. 25, 2013, and claims priority to the Ser. No. 13/870,644 application. The Specification of Ser. No. 13/870,644 is hereby fully incorporated by reference.

FIELD

Embodiments of the present disclosure generally relate to the field of integrated circuits, and more particularly, to techniques and configurations for surface finishes of integrated circuit package substrates.

BACKGROUND

The input/output density of dies, such as processors, is continually increasing. In order to keep up with the increasing input/output densities the package substrates to which the dies are attached must also scale correspondingly. Under the current state of the art, a single surface finish is applied to both a die and a land side of a package substrate. The die side of a package substrate is the side on which the die attaches, while the land side of a package substrate attaches to a circuit board. This single surface finish may grow, or expand, laterally after application which may cause pad-to-pad bridging on the die side of the substrate if the pads are located too closely together. Therefore, the expansion of the surface finish on the die side limits the scalability of the package substrate. The surface finish composition on the land side, however, may be dictated based upon considerations related to circuit board connection requirements. These considerations do not necessarily extend to the die side connection requirements; however, under the current state of the art the same surface finish is applied to both the die side and the land side of the package substrate.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
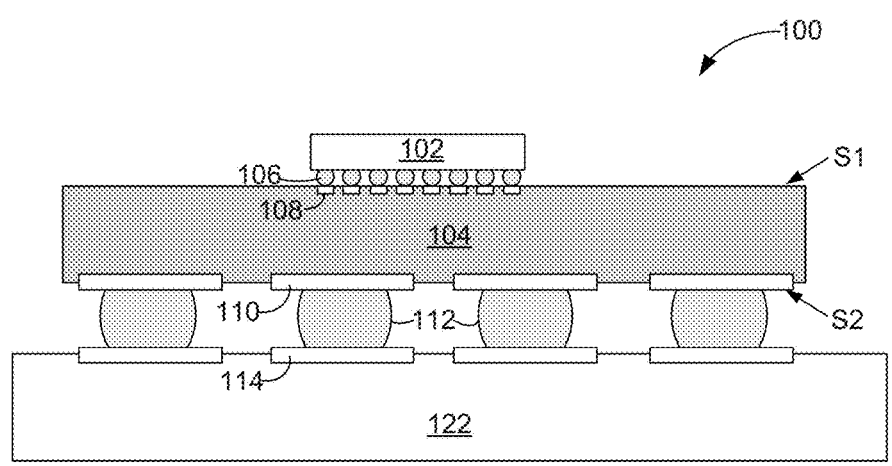
FIG. 1 schematically illustrates a cross-section side view of an example integrated circuit (IC) assembly, in accordance with some embodiments.

Embodiments of the present disclosure describe techniques and configurations for dual surface finish package substrate assemblies. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly 100 configured to use a dual surface finish on electrical routing features embedded in package substrate 104. In some embodiments, the IC assembly 100 may include one or more dies (hereinafter "die 102") electrically and/or physically coupled with package substrate 104, as can be seen. The package substrate 104 may further be electrically coupled with a circuit board 122, as can be seen. As used herein, the die side of a package substrate is the side on which the die attaches (e.g., side S1), while the land side of a package substrate is the side that attaches to the circuit board (e.g., side S2). In some embodiments, the IC assembly 100 may refer only to the package substrate 104.

According to various embodiments, a first surface finish may be disposed on electrical routing features, such as one or more lands, on side S2 of package substrate 104. A second surface finish on electrical routing features of side S1 may be disposed as described herein (e.g., surface finish 401 or 501 of respective FIG. 4 or 5). The second surface finish may be configured in the IC assembly 100 to route electrical signals of the die 102 through various components of the IC assembly 100. The electrical signals may include, for example, input/output (I/O) signals, radio frequency (RF) signals or power/ground associated with operation of the die 102. This second surface finish may have a different chemical composition than the first surface finish. For example, while the first surface finish may be nickel-based, the second surface finish may be gold-based, such as that applied using a direct immersion gold (DIG) process.

The die 102 can be attached to the package substrate 104 according to a variety of suitable configurations including, a flip-chip configuration, as depicted, or other configurations such as, for example, being embedded in the package substrate 104 or being configured in a wirebonding arrangement. In the flip-chip configuration, the die 102 may be attached to a surface of the package substrate 104 having the second surface finish using die interconnect structures 106 such as bumps, pillars, or other suitable structures that may also electrically couple the die 102 with the package substrate 104. This second surface finish may, as discussed further below, enable the die interconnect structures 106 to be spaced more closely together than would be allowed using a single surface finish on both sides S1 and S2 of package substrate 104 and thereby allow for increased input/output density.

The die 102 may represent a discrete chip made from a semiconductor material and may be, include, or be a part of a processor, memory, or ASIC in some embodiments. In some embodiments, an electrically insulative material such as, for example, molding compound or underfill material (not pictured) may partially encapsulate a portion of the die 102 and/or interconnect structures 106. The die interconnect structures 106 may be configured to route the electrical signals between the die 102 and the package substrate 104.

The package substrate 104 may include electrical routing features configured to route electrical signals to or from the die 102. The electrical routing features may include, for example, traces (such as trace 321 depicted in FIGS. 3-5) disposed on one or more surfaces of the package substrate 104 and/or internal routing features such as, for example, trenches, vias or other interconnect structures (such as via 319 depicted in FIGS. 3-5) to route electrical signals through the package substrate 104. For example, in some embodiments, the package substrate 104 may include electrical routing features (such as die bond pads 108), having the second surface finish applied thereon, configured to receive the die interconnect structures 106 and route electrical signals between the die 102 and the package substrate 104.

In some embodiments, the package substrate 104 is an epoxy-based laminate substrate having a core (e.g., central core 305 of FIGS. 3-5) and/or build-up layers such as, for example, an Ajinomoto Build-up Film (ABF) substrate. The package substrate 104 may include other suitable types of substrates in other embodiments including, for example, substrates formed from glass, ceramic, or semiconductor materials.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown), for example, vias such as those described in reference to FIG. 2 and depicted in FIGS. 3-5, may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 702 of FIG. 7).

Package-level interconnects such as, for example, solder balls 112 or land-grid array (LGA) structures may be coupled to one or more lands (hereinafter "lands 110") on the package substrate 104 and one or more pads 114 on the circuit board 122 to form corresponding solder joints that are configured to further route the electrical signals to between the package substrate 104 and the circuit board 122. In some embodiments, the lands 110 may have the first surface finish disposed thereon. The first surface finish may be comprised of any suitable electrically conductive material such as metal including, for example, nickel (Ni), palladium (Pd), gold (Au), silver (Ag), copper (Cu), or combinations thereof. Other suitable techniques to physically and/or electrically couple the package substrate 104 with the circuit board 122 may be used in other embodiments.

Figure 2:
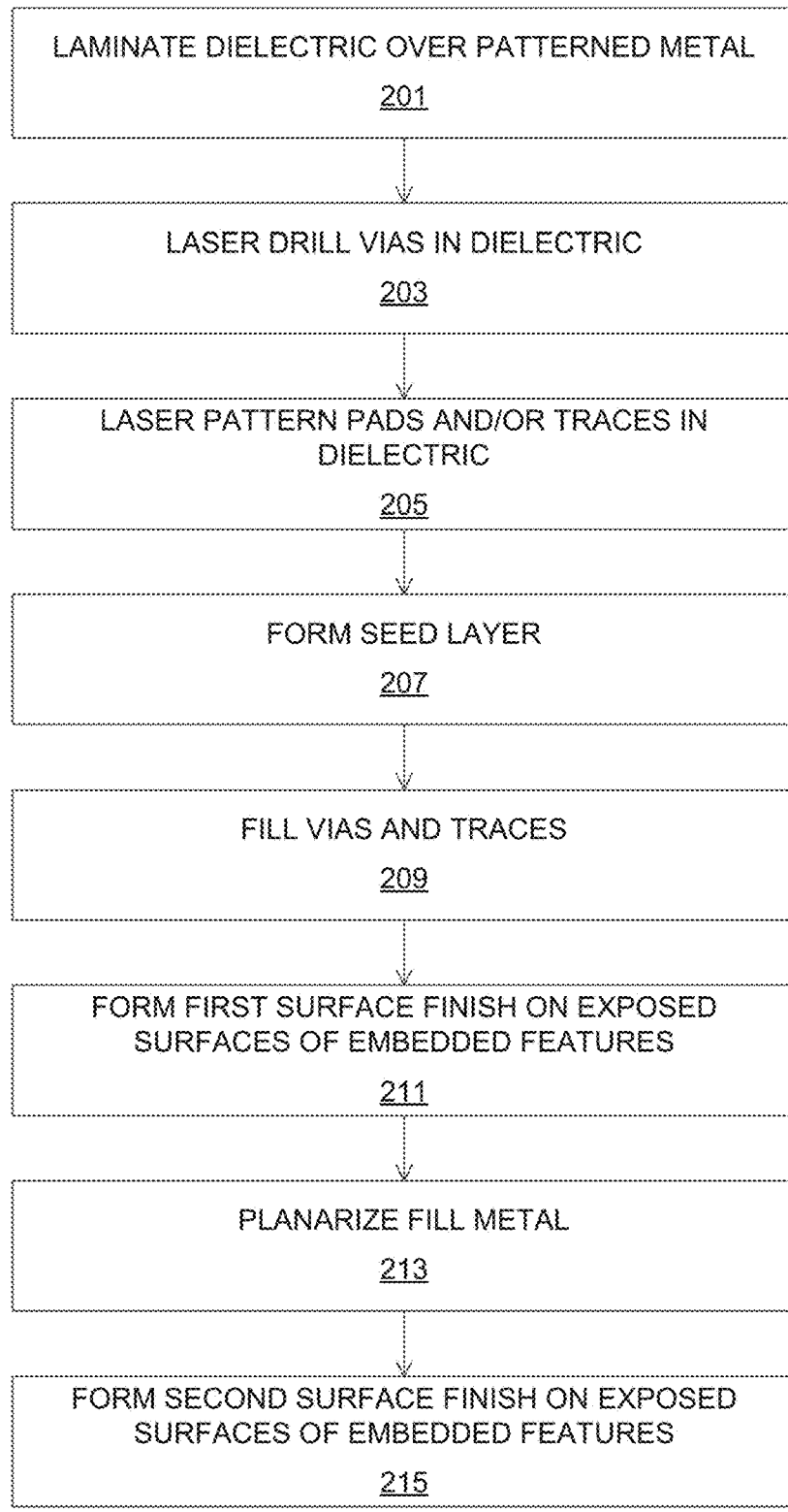
FIG. 2 is an illustrative flow diagram of a package substrate fabrication process utilizing dual surface finish in accordance with an embodiment of the present disclosure.
Figure 3:
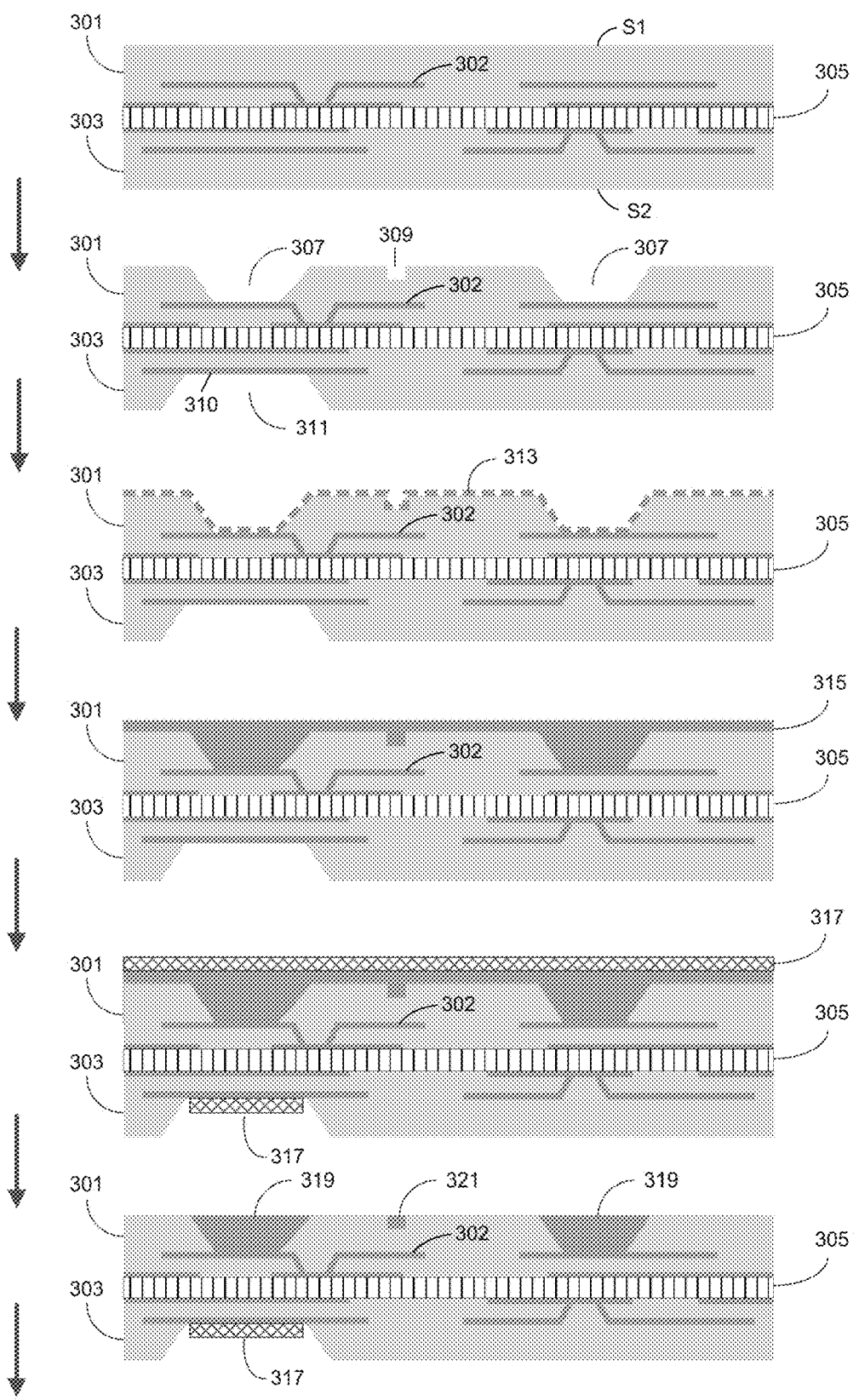
FIG. 3 is an illustrative cross-sectional view of selected operations illustrating stages in the package substrate fabrication process described in FIG. 2, in accordance with an embodiment of the present disclosure.
Figure 4:
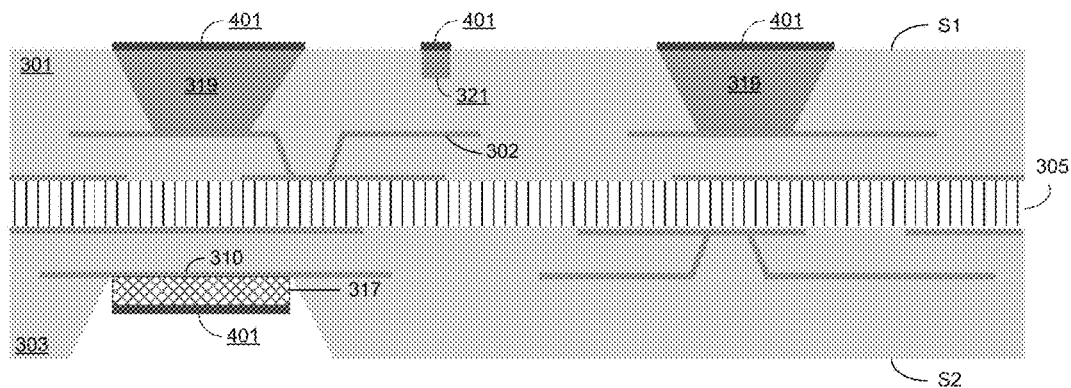
FIG. 4 is an illustrative cross-sectional view of a package substrate with a second surface finish applied through a direct immersion gold (DIG) process.
Figure 5:
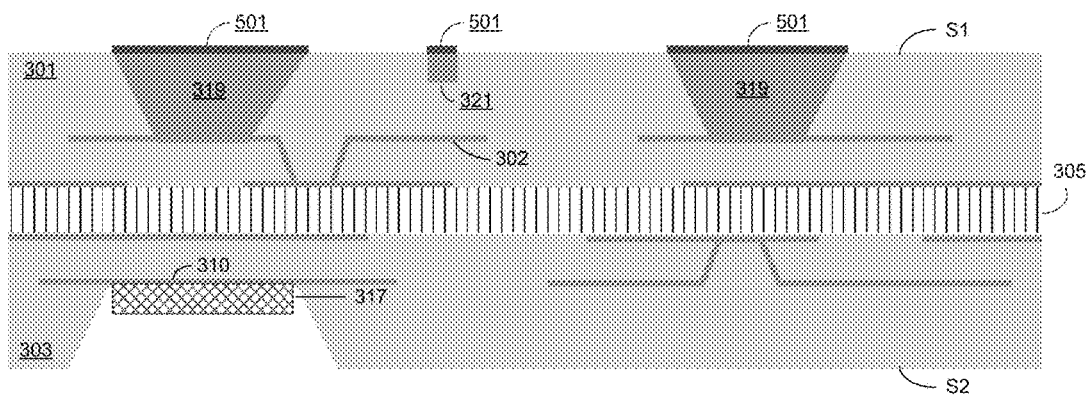
FIG. 5 is an illustrative cross-sectional view of a package substrate with a second surface finish applied through an organic solderability preservative (OSP) process.

FIG. 2 is an illustrative flow diagram of a package substrate fabrication process 200 for applying a dual surface finish in accordance with an embodiment of the present disclosure. FIGS. 3-5 provide cross-sectional views of selected operations illustrating stages in the package substrate fabrication process 200, in accordance with an illustrative embodiment.

Process 200 may begin at operation 201 with lamination of a dielectric layer (e.g., dielectric layer 301 or 303 of FIG. 3) over a patterned metal layer (e.g., sub-surface-level metal feature 302 of FIG. 3). Generally, the patterned metal layer and any number of layers below the patterned metal layer may be formed in any manner known in the art. For example, the patterned metal layer may be a top build-up layer formed with a semi-additive process (SAP). The dielectric layer may be of any composition known in the art and may be applied over the patterned sub-surface level metal layer in any conventional manner. For example, in some embodiments, the dielectric layer may comprise a polymer (epoxy-based resin) that may have a silica filler to provide suitable mechanical properties that meet reliability requirements of the package.

Returning to FIG. 2, at operation 203, one or more via holes and/or one or more land holes (e.g., via holes 307 or land hole 311 of FIG. 3) may be laser drilled into the dielectric layer (e.g., dielectric layer 301 or 303 of FIG. 3) to expose a portion of the underlying metal layer (e.g., sub-surface-level metal 302 of FIG. 3). For example, the via holes 307 may expose a portion of the underlying metal layer to allow formation of a die bond pad thereon. In some embodiments, the exposed portion of the underlying metal layer in the via holes 307 may be a die bond pad or part of a die bond pad. In some embodiments, the die bond pad may include via 319 with surface finish 401 or 501 of FIGS. 4 and 5, respectively. In other embodiments, the die bond pad may include any other suitable well-known structures. The land hole 311 may expose a portion of the underlying metal layer that is configured to serve as a land structure (hereinafter "land 310"). The land 310 may be configured to form a bond with electrically conductive material of a corresponding package-level interconnect. Any conventional technique may be used to laser drill the via holes or land holes, such as one employing carbon dioxide ($CO_2$) laser. Other suitable techniques to form via holes or land holes may be used in other embodiments.

At operation 205, the dielectric layer is patterned (e.g., by laser) to form a trace recess (e.g., trace recess 309 of FIG. 3) and/or a pad recess (not depicted) with a depth in the dielectric layer that is less than that of the vias, such that the sub-surface level metal feature is not exposed by the patterning operation. Although not depicted in FIG. 3, it should be appreciated that a pad recess disposed over the via holes 307 may also be formed by the process which forms the trace recess 309. The trace recess 309 and/or a pad recess, may be patterned or formed, for example, with an excimer laser.

Next, at operation 207, a seed layer (e.g., seed layer 313 of FIG. 3) is formed. In one embodiment, electroless plating is used to form the seed layer 313. For example, a catalyst, such as palladium (Pd) may be deposited followed by an electroless copper plating process. In an alternate embodiment, a physical vapor deposition (e.g., sputtering) technique is used to deposit the seed layer 313. The via holes, trace recesses, and/or pad recesses are then filled at operation 209, for example, with an electrolytic plating process, such as an electrolytic copper plating process. The seed layer may be formed according to other suitable techniques in other embodiments.

At operation 211, a first surface finish metal (e.g., surface finish 317) is formed on exposed surfaces of the embedded metal features (e.g., fill metal 315 and land 310 formed in dielectric layer 303). According to various embodiments, the first surface finish metal is of a different material composition than the fill metal 315. A variety of surface finish metal compositions or plated stacks may be employed. In the illustrative embodiment depicted in FIG. 3, an electroless plating process is used to form the surface finish 317 comprising any suitable electrically conductive material such as metal including, for example, nickel (Ni), palladium (Pd), gold (Au), silver (Ag), copper (Cu), and combinations thereof. In an illustrative embodiment, the surface finish 317 includes a 6-8 micron (μm) thick nickel layer.

At operation 213, over-plated fill metal and the first surface finish are removed from dielectric layer 301 by one or more of, etching, buff grinding, chemical-mechanical polishing, etc. to planarize the fill metal 315. For example, chemical, mechanical polishing (CMP) or buff grinding may be used to first planarize the fill metal 315 and then an etch may be employed to remove any remaining fill metal 315 from the top surface of the dielectric layer 301, thereby delineating via 319 and trace 321. As can be seen, the via 319 and/or trace 321 may be an embedded metallized structure of the package substrate. The trace 321 may be a necking trace that is carrying a signal from a connection that has been made between the die and substrate elsewhere and therefore may not be bonded directly to the solder on the die side. This operation may leave the surface finish 317 disposed on land 310, as depicted in FIG. 3. In an illustrative embodiment, the surface finish 317 may be 6-8 μm thick.

At operation 215, a second surface finish, such as 401 of FIG. 4 or 501 of FIG. 5, is formed on the exposed surfaces of the embedded metal features (e.g., metallized via 319 and trace 321). This second surface finish may be deposited through a process such as a direct immersion gold (DIG) process and/or an organic solderability preservative (OSP) process. In some embodiments, the second surface may be applied to embedded metal features on both sides of the package substrate, such as S1 and S2 of FIG. 4, as depicted by surface finish 401 of FIG. 4. In other embodiments, the second surface finish may be applied to embedded metal features of only side S1, as depicted by 501 of FIG. 5. In embodiments, the second surface finish may have a different chemical composition than the first surface finish. In some embodiments, this second surface finish may be comprised of gold and/or imidazole, or an imidazole derivative, such as, but not limited to, benzimidazole or phenylimidazole. In an illustrative embodiment, the second surface finish may be less than 0.5 μm, 500 nanometers (nm), thick.

With the second surface finish metal formed on the via 319, the "top pad" is referred to herein as "metal-defined" rather than photo-defined or solder resist-defined. In some embodiments, the critical dimension (CD), or minimum lateral width, of a surface finish at a connection point may be at least as large as the largest diameter of a via 319 or trace 321; however, because the second surface finish may be less than 500 nm thick, the lateral expansion of the surface finish metal, on the metallized via 319 or metallized trace 321, is reduced allowing a reduction in the space between adjacent embedded metallized elements. For example, where connection points have a pitch (e.g., bump pitch), this minimized lateral expansion of the surface finish may enable a 50 μm bump pitch where the pad size is 49 μm which would provide higher I/O routing density than is possible with the current state of the art.

FIG. 4 is an illustrative cross-sectional view of a package substrate, such as that described in reference to FIGS. 2 and 3, above, with a second surface finish applied through a direct immersion gold (DIG) process. The DIG process may be used to deposit a second surface finish (surface finish 401), comprised of gold, on the vias 319, the trace 321, and the surface finish 317. In this embodiment, the surface finish 401 is sufficiently thin that the thickness it adds to the first surface finish would have a negligible effect on the physical and/or electrical connection between the land 310 of the package substrate and the pad of the circuit board (e.g., pad 114 of FIG. 1).

FIG. 5 is an illustrative cross-sectional view of a package substrate with a second surface finish applied through an organic solderability preservative (OSP) process. The OSP process may be used to deposit a second surface finish (surface finish 501), comprised of imidazole or one of its derivatives, on the vias 319 and the trace 321. In this embodiment, the selective application of the OSP process may prevent the second surface finish from being deposited on the first surface finish 317. In either the OSP or DIG processes the second surface finish (e.g. surface finish 401 or 501) may range in thickness from 60 nm to 300 nm.

Figure 6:
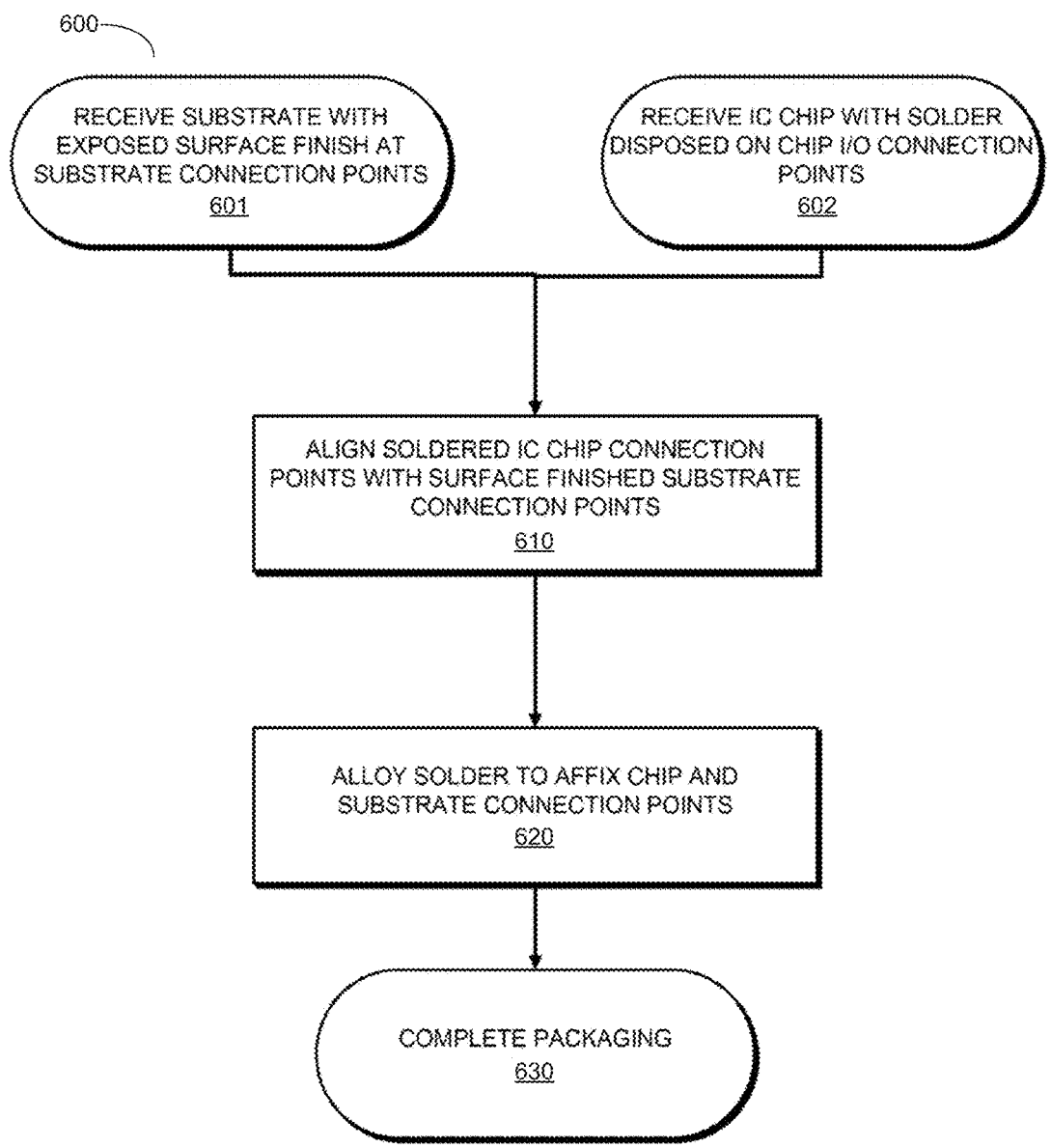
FIG. 6 is an illustrative flow diagram of an assembly process utilizing a package substrate with dual surface finish in accordance with an embodiment of the present disclosure.

FIG. 6 is an illustrative flow diagram of an assembly process 600 utilizing a package substrate with dual surface finish in accordance with an embodiment of the present disclosure. Such a package substrate may be produced through the illustrative method described in reference to FIG. 2, above, and may be depicted in FIGS. 4 and 5.

Assembly process 600 begins at operation 601 with receiving a package substrate with exposed surface finish at predetermined substrate connection points. As such, in the illustrative embodiments, no solder resist is present on the surface of the package substrate and no solder is placed on the surface finish prior to coupling a chip to the package substrate. Either of the package substrates depicted in FIG. 4 or 5 may be used in the assembly process 600.

At operation 602, an IC chip may be received with solder bumps disposed on the chip connection points. While the IC chip may generally be of any conventional type, in a particular embodiment, the IC chip may be a processor, such as a microprocessor, having a large I/O count. In an embodiment, the chip I/O and power solder bumps may have a pitch of 50 μm, as described above. At operation 610, the IC chip may be aligned with the surface finished substrate to have the soldered IC chip connection points aligned with the surface finished substrate connection points. The chip side solder is then alloyed at operation 620 to affix the chip to the substrate connection points which completes the packaging 630.

Figure 7:
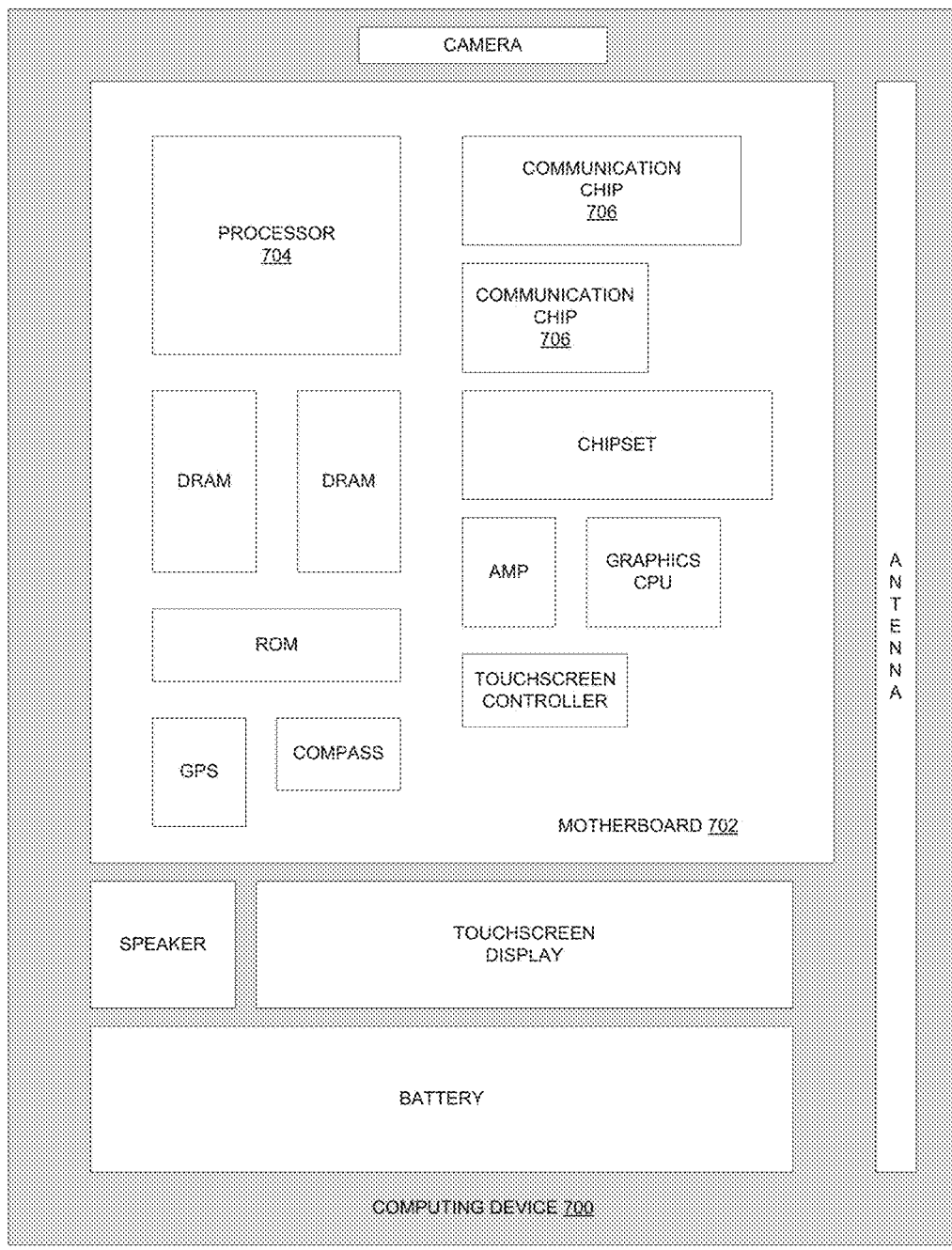
FIG. 7 schematically illustrates a computing device that includes a package substrate having a dual surface finish, in accordance with some embodiments.

Embodiments of the present disclosure may be implemented into a system using any suitable hardware and/or software to configure as desired. FIG. 7 schematically illustrates a computing device that includes a package substrate as described herein, such as that depicted by FIG. 4 or 5, in accordance with some embodiments. The computing device 700 may house a board such as motherboard 702. The motherboard 702 may include a number of components, including but not limited to a processor 704 and at least one communication chip 706. The processor 704 may be physically and electrically coupled to the motherboard 702. In some implementations, the at least one communication chip 706 may also be physically and electrically coupled to the motherboard 702. In further implementations, the communication chip 706 may be part of the processor 704.

Depending on its applications, computing device 700 may include other components that may or may not be physically and electrically coupled to the motherboard 702. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 706 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 706 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 706 may operate in accordance with other wireless protocols in other embodiments.

The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 may be packaged in an IC assembly (e.g., IC assembly 100 of FIG. 1) that includes a package substrate as described herein. For example, the circuit board 122 of FIG. 1 may be a motherboard 702 and the processor 704 may be a die 102 mounted on a package substrate 104 as described herein. The package substrate 104 and the motherboard 702 may be coupled together using package-level interconnects as described herein. The term "processor" may refer to any device or portion of a device that processes electronic data from registers and/or memory to transform that electronic data into other electronic data that may be stored in registers and/or memory.

The communication chip 706 may also include a die (e.g., die 102 of FIG. 1) that may be packaged in an IC assembly (e.g., IC assembly 100 of FIG. 1) that includes a package substrate 104 as described herein. In further implementations, another component (e.g., memory device or other integrated circuit device) housed within the computing device 700 may include a die (e.g., die 102 of FIG. 1) that may be packaged in an IC assembly (e.g., IC assembly 100 of FIG. 1) that includes a package substrate 104 as described herein.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

EXAMPLES

According to various embodiments, the present disclosure describes a number of examples. Example 1 is a method of forming an integrated circuit (IC) package substrate comprising depositing a first surface finish on one or more electrical routing features disposed on a first side of a package substrate and on one or more lands disposed on a second side of the package substrate, the second side being disposed opposite to the first side; removing the first surface finish on the first side of the package substrate; and depositing a second surface finish on the one or more electrical routing features, wherein the depositing of the second surface finish is accomplished by one of a Direct Immersion Gold (DIG) process or an Organic Solderability Preservative (OSP) process.

Example 2 may include the subject matter of Example 1, wherein the depositing of the second surface finish is accomplished by a Direct Immersion Gold (DIG) process.

Example 3 may include the subject matter of Example 1, wherein the depositing of the second surface finish is accomplished by an Organic Solderability Preservative (OSP) process.

Example 4 may include the subject matter of Example 1, wherein the depositing of the first surface finish on one or more die bond pads and one or more lands occurs simultaneously using a plating process.

Example 5 may include the subject matter of Example 1, wherein a planarizing process is used, at least in part, in removing the first surface finish on the first side.

Example 6 may include the subject matter of Example 1, further comprising forming the electrical routing features using a method comprising laminating a dielectric material over a metal conductor to form a dielectric layer; selectively removing, by a laser, dielectric material to form voids in the dielectric layer revealing the metal conductor; plating a fill metal into the voids created by the laser; and planarizing the fill metal to a level even with a surface of the dielectric layer.

Example 7 may include the subject matter of Example 1, wherein depositing the first surface finish is performed using an electroless plating process.

Example 8 may include the subject matter of Example 1, wherein depositing the first surface finish comprises depositing nickel (Ni).

Example 9 may include the subject matter of Example 8, wherein depositing the first surface finish further comprises depositing one or both of palladium or gold.

Example 10 may include the subject matter of Example 9, wherein depositing the first surface finish comprises depositing gold using an electroless nickel-immersion gold (ENIG+EG) process.

Example 11 is a package substrate comprising a first side including one or more lands, the one or more lands having a first surface finish disposed on the one or more lands; and a second side disposed opposite to the first side, the second side including one or more electrical routing features having a second surface finish disposed on, and in direct contact with, the one or more electrical routing features. The electrical routing features are configured to bond with die interconnect structures of one or more dies and the second surface finish has different chemical composition than the first surface finish.

Example 12 may include the subject matter of Example 11, wherein the first surface finish is an outermost surface finish on the one or more lands and the second surface finish is an outermost surface finish on the one or more electrical routing features.

Example 13 may include the subject matter of Example 11, wherein the second surface finish is imidazole or an imidazole derivative.

Example 14 may include the subject matter of Example 11, wherein the second surface finish is gold.

Example 15 may include the subject matter of Example 11, wherein the second surface finish has a thickness of less than or equal to 500 nanometers.

Example 16 may include the subject matter of Example 11, wherein the second surface finish is disposed on the first surface finish of the one or more lands of the first side.

Example 17 may include the subject matter of Example 11, wherein the one or more electrical routing features disposed on the second side include one or more vias.

Example 18 may include the subject matter of Example 11, wherein the first surface finish comprises nickel (Ni).

Example 19 may include the subject matter of Example 18, wherein the first surface finish further comprises one or both of palladium (Pd) or gold (Au).

Example 20 may include the subject matter of Example 11, wherein the electrical routing features are disposed in a dielectric layer.

Example 21 is a package assembly comprising an integrated circuit (IC) chip having one or more input/output (I/O) connection points and one or more power connection points; and a package substrate including: a first side including one or more lands, the one or more lands having a first surface finish disposed on the one or more lands; and a second side disposed opposite to the first side, the second side including one or more electrical routing features having a second surface finish disposed on, and in direct contact with, the one or more electrical routing features. The second surface finish has different chemical composition than the first surface finish and the second surface finish is affixed to the one or more I/O connection points or the one or more power connection points by solder.

Example 22 may include the subject matter of Example 21, wherein the IC chip is a processor.

Example 23 may include the subject matter of Example 21, further comprising one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board, wherein the package assembly is part of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

Example 24 is an apparatus for forming an integrated circuit (IC) package substrate comprising means for depositing a first surface finish on one or more electrical routing features disposed on a first side of a package substrate and on one or more lands disposed on a second side of the package substrate, the second side being disposed opposite to the first side; means for removing the first surface finish on the first side of the package substrate; and means for depositing a second surface finish on the one or more electrical routing features, wherein the depositing of the second surface finish is accomplished by one of a Direct Immersion Gold (DIG) process or an Organic Solderability Preservative (OSP) process.

Example 25 may include the subject matter of Example 24, wherein the means for depositing the second surface finish further includes means for performing a Direct Immersion Gold (DIG) process.

Example 26 may include the subject matter of Example 24, wherein the means for depositing the second surface finish further includes means for performing an Organic Solderability Preservative (OSP) process.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method of forming an integrated circuit (IC) package substrate comprising:
   providing a package substrate having a first side and a second side opposite the first side, the package substrate including a first dielectric layer forming the first side, and a second dielectric layer forming the second side, a central core comprising one or more dies being disposed between the first dielectric layer and the second dielectric layer;
   depositing a first surface finish on one or more electrical routing features disposed on the first side of a package substrate and on one or more lands disposed on the second side, the first dielectric layer comprising an outer surface of the first side of the package substrate, wherein the one or more electrical routing features are further disposed in, and extend through, the first dielectric layer of the first side, wherein the one or more electrical routing features have an outer surface that is coplanar with the outer surface of the first dielectric layer;
   removing the first surface finish from the first side of the package substrate, the first surface finish remaining on the one or more lands of the second side; and
   depositing a second surface finish on and in direct contact with the outer surface of the one or more electrical routing features on the first side of the package substrate, and on the first surface finish remaining on one or more lands of the second side,
   wherein the one or more electrical routing features have a pitch to bond with die interconnect structures of the one or more dies, wherein the second surface finish has a different chemical composition than the first surface finish, wherein a bump pitch of the electrical routing features is 50 micrometers, and wherein the electrical routing features include a pad size of 49 micrometers.

2. The method of claim 1, wherein the depositing of the second surface finish is accomplished by a Direct Immersion Gold (DIG) process.

3. The method of claim 1, wherein the depositing of the second surface finish is accomplished by an Organic Solderability Preservative (OSP) process.

4. The method of claim 1, wherein the depositing of the first surface finish on one or more electrical routing features and one or more lands occurs simultaneously using a plating process.

5. The method of claim 1, wherein a planarizing process is used, at least in part, in removing the first surface finish on the first side.

6. The method of claim 1, further comprising forming the electrical routing features using a method comprising:
   laminating a dielectric material over a metal conductor to form a dielectric layer;
   selectively removing, by a laser, dielectric material to form voids in the dielectric layer revealing the metal conductor;
   plating a fill metal into the voids created by the laser; and
   planarizing the fill metal to a level even with a surface of the dielectric layer.

7. The method of claim 1, wherein depositing the first surface finish is performed using an electroless plating process.

8. The method of claim 1, wherein depositing the first surface finish comprises depositing nickel (Ni).

9. The method of claim 8, wherein depositing the first surface finish further comprises depositing one or both of palladium or gold.

10. The method of claim 9, wherein depositing the first surface finish comprises depositing gold using an electroless nickel-immersion gold (ENIG+EG) process.

* * * * *